United States Patent [19]

Evans et al.

[11] Patent Number: 4,604,292

[45] Date of Patent: Aug. 5, 1986

[54] X-RAY MASK BLANK PROCESS

[75] Inventors: Robert D. Evans, Bedford; Ward D. Halverson, Cambridge, both of Mass.

[73] Assignee: Spire Corporation, Bedford, Mass.

[21] Appl. No.: 727,782

[22] Filed: Apr. 26, 1985

[51] Int. Cl.<sup>4</sup> .............................................. B05D 3/06
[52] U.S. Cl. ........................................ 427/39; 118/69; 427/299; 430/967
[58] Field of Search ........................... 427/38, 39, 299; 430/967, 966; 118/69

[56] References Cited

U.S. PATENT DOCUMENTS

| 4,325,776 | 4/1982 | Menzel | 427/299 |
|---|---|---|---|
| 4,440,108 | 4/1984 | Little et al. | 118/719 |
| 4,443,488 | 4/1984 | Little et al. | 427/38 |
| 4,539,278 | 9/1985 | Williams et al. | 430/966 |
| 4,543,266 | 9/1985 | Matsuo et al. | 427/38 |

OTHER PUBLICATIONS

A. C. Adams et al., "The Chemical Deposition of Boron-Nitrogen Films," *J. Electro Chem. Soc.* 127, Feb. 1980, pp. 399–405.

A. R. Shimkunas, "Advances in X-ray Mask Technology," *Solid State Technology*, Sep. 1984, pp. 192–199.

*Primary Examiner*—John H. Newsome
*Attorney, Agent, or Firm*—Morse, Altman & Dacey

[57] ABSTRACT

An improved process, optimizing quality and growth rate with independent control of residual stress, is disclosed for the growing of membranes for use as X-ray lithography mask blanks. The process comprises providing a mounting fixture and a low-cost substrate material thereon, cooling the substrate to about the boiling point of hydrogen by passing a liquid coolant in contact with the fixture, depositing by a low-temperature plasma-enhanced method a thin membrane onto the cooled substrate, removing the substrate and the thereon deposited membrane from the fixture, and allowing the substrate thermally to expand by gradually assuming ambient room temperature, whereby the membrane will acquire optimum tensile stress. Preferably, the low-cost substrate is low grade industrial silicon and the membrane is formed of boron nitride, silicon carbide, silicon nitride, amorphous silicon, diamondlike carbon, aluminum oxide, beryllium and silicon oxide.

10 Claims, 2 Drawing Figures

X-RAY MASK BLANK PROCESS

BACKGROUND OF THE INVENTION

1. Field of the Invention

The present invention is related generally to X-ray mask blanks and, more particularly, to an improved process of growing quality membranes for use as X-ray mask blanks at optimized growth rates.

2. The Prior Art

X-ray masks are required in X-ray lithography systems for making microcircuits, memories and other high-density electronic components. An X-ray mask is a thin-film X-ray transparent membrane that is in tension and which has been patterned with an X-ray absorber material. The X-ray mask must be flat and possess good dimensional stability, tensile strength and tensile stress, and exhibit low defect densities, both when it is patterned and thereafter, to yield quality high-density electronic components. The tension in the membrane must be sufficiently high to achieve the required flatness yet must be below the limit of its tensile strength to prevent its fracture.

The tension in the membrane now is obtained in one of two ways: a/ the membrane is formed in slack form and then mechanically stretched over a rigid frame to the desired tension; or b/ the membrane is deposited from vapor on a sacrificial substrate to a level of residual stress determined by deposition process parameters, and the substrate chemically etched away, leaving a taut membrane on a ring of the remaining substrate material. See "Advances in X-Ray Mask Technology," A. R. Shimkunas, *Solid State Technology*, September 1984, pp. 192–199.

The mechanical stretching technique requires the handling, stretching and bonding of thin films, frequently less than 5,000 nanometers in thickness. Such operations are delicate, time consuming and also often result in the loss of a significant portion of the membranes so produced.

In the second technique, the resultant residual stress in the membrane is a function of the selected deposition process parameters, including the reactant ratio, the temperature of the reactant gases forming the vapor during their reaction, the temperature of the substrate during deposition, and the post-deposition annealing cycle. Materials suitable as X-ray mask membranes, such as for example boron nitride, typically are formed in a radio-frequency driven plasma or by chemical vapor deposition, usually at low pressure and high temperature, and with substrate temperatures ranging anywhere from ambient to about 1,000° C. The boron nitride thin films usually are generated by low pressure chemical vapor deposition, using diborane ($B_2H_6$) and ammonia ($NH_3$) in a background gas such as nitrogen ($N_2$). See "The Chemical Deposition of Boron-Nitrogen Films," A. C. Adams et al, *J. Electrochem. Soc.*, 127, (1980) pp. 399–405. The residual stress in the resultant thin boron nitride film depends primarily on the ratio of the diborane gas to the ammonia gas and upon the temperature of the substrate. For example, a high diborane gas to ammonia gas ratio coupled with a lower substrate temperature usually results in a higher residual tensile stress. On the other hand, a low diborane gas to ammonia gas ratio combined with a higher substrate temperature will introduce compressive stresses into the resultant thin film, rendering such films undesirable and unsuitable for use as X-ray mask blanks. The quality of the membranes, such as transparency, yield strength, defect density, crystallographic form and creep resistance, also are critically dependent on the deposition process parameters. These deposition process parameters, for the most part, must be adjusted so as to yield a compromise between film quality, membrane residual stress, and film growth rate.

SUMMARY OF THE INVENTION

It is a principal object of the present invention to overcome the above disadvantages by providing an improved process of growing a membrane for use as an X-ray mask blank.

More specifically, it is an object of the present invention to provide an improved process of growing a membrane for use as an X-ray mask blank, which process permits the selection of the deposition process parameters with a view to optimize film quality and growth rate while at the same time achieving independent control over the residual stress to be formed in the film, that is independent of the selection of the deposition process parameters. The process essentially comprises providing a mounting fixture with a suitable low-cost substrate thereon, lowering the temperature of the substrate to about 20° Kelvin by cooling the supporting mounting fixture thereof, depositing a thin membrane onto a cooled surface of the substrate maintained at about the same cooled temperature, removing the combination substrate and the thereon deposited membrane from the mounting fixture, and allowing the substrate to assume ambient room temperature, thermally expanding thereby and providing the thereon deposited membrane with a corresponding stretching, the membrane thus acquiring optimum tensile stress. Preferably, the deposition of the membrane is effected by a low-temperature plasma-enhanced method. Preferably, the low-cost substrate is amorphous silicon. Preferably, the membrane is formed of materials including boron nitride, silicon carbide, silicon nitride, amorphous silicon, diamond-like carbon, aluminum oxide, beryllium and silicon oxide.

Other objects of the present invention will in part be obvious and will in part appear hereinafter.

The invention accordingly comprises the improved process of the present disclosure, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accompanying drawings, wherein.

DETAILED DESCRIPTION OF THE PREFERRED EMBODIMENT

In general, the present invention provides an improved process of growing thin membranes of consistently good quality and at high growth rates for use as X-ray lithography mask blanks characterized by minimum defects and possessing optimum residual stress. Preferably, the process comprises providing a mounting fixture 10, with a low-cost substrate 12 material disposed on the fixture 10, cooling the substrate 12 to about the boiling point of hydrogen (about 21° Kelvin) by cooling the fixture 10 with a liquid coolant, depositing by a low-temperature plasma-enchanced method a thin membrane 14 onto a surface 16 of the cooled substrate, removing the substrate 12 and the thereon deposited thin membrane 14 from the fixture 10, and allowing the substrate 12 thermally to expand by assuming ambient room temperature, whereby the membrane 14 will be stretched by the expanding substrate 12 to acquire thereby the required optimum tensile stress. The differential expansion of the temperature controlled substrate 12 thus modifies any stress or compression in the membrane 14, inherently obtained therein during its deposition, to the desired optimum value upon equilibration of the substrate's 12 temperature with room temperature. The thus stretched membrane 14 is now ready for patterning, once the central portion of the substrate 12 has been removed, as by being chemically etched away.

One preferred low-temperature plasma-enhanced deposition method for the thin membrane 14 onto the surface 16 of the cooled low-cost substrate 12 is disclosed in U.S. Pat. No. 4,443,488 of Roger G. Little et al., entitled "Plasma Ion Deposition Process," that issued on April 17, 1984 and assigned to a common assignee, the disclosure of which is incorporated herein by reference. Other low-temperature plasma-enhanced deposition methods also can be employed, however, including ion plating and sputter-coating. A preferred apparatus for use in the low-temperature plasma-enhanced deposition method is disclosed in U.S. Pat. No. 4,440,108 of Roger G. Little, et al, entitled "Ion Beam Coating Apparatus," that issued on April 3, 1984 and also assigned to a common assignee, the disclosure of which also is incorporated herein by reference.

Figure 1:
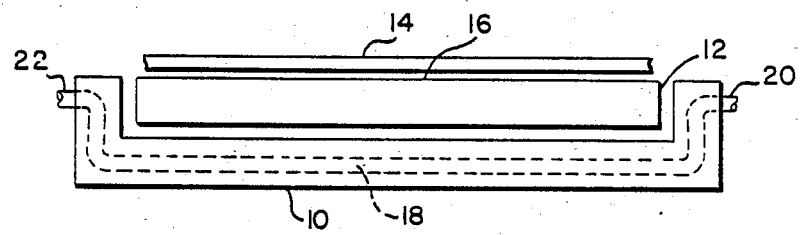
FIG. 1 is a schematic elevation of a device, used in the process of the invention and illustrating one step thereof.
Figure 2:
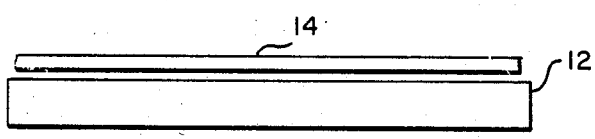
FIG. 2 is a view similar to FIG. 1 but illustrating a further step in the process of the invention.

As may be observed in FIG. 1, the mounting fixture 10 preferably is provided with a channel 18, and having an inlet 20 and an outlet 22. A suitable liquid coolant, such as for example liquid nitrogen or other liquified gases, preferably is pumped through the channel 18 at a rate sufficient to cool the temperature of the fixture 10 to the desired level, and to maintain it at that desired level. The desired level could be as low as the boiling point of hydrogen (about 21° Kelvin) or lower. Preferably, the range of temperatures to which the mounting fixture 10 is cooled is between about 20° Kelvin ($-253°$ C.) to about 77° Kelvin ($-196°$ C.). Preferably, the low-cost substrate 12 is formed of low grade industrial silicon or amorphous silicon (alpha-Si), or like material. Preferably, the thin membrane 14 is formed of one of the following group of materials: boron nitride (BN), silicon carbide (SiC), silicon nitride (SiN), amorphous silicon (alpha-Si), diamond-like carbon, aluminum oxide ($Al_3O_3$), beryllium (Be) and silicon oxide ($SiO_2$). Preferably, the thin membrane 14 is deposited with a thickness ranging from about 500 to about 6,000 nanometers and, with a growth rate such that the desired thickness of the thin membrane 14 is effected within about two hours of deposition.

Typical tensile stress levels achievable by the process of the invention, employing a silicon substrate and growing a thin boron nitride membrane thereon, are computed from the following equation:

$$S = E(K_s - K_m)\Delta T$$

where S is the tensile stress expressed in dynes per square-centimeter, E is Young's modulus also expressed in dynes per square-centimeter, $K_s$ is the coefficient of thermal expansion of the substrate and $K_m$ is the coefficient of expansion of the membrane, and $\Delta T$ is the temperature change occurring within the cooled substrate when warming to ambient room temperature and expressed in degrees of Kelvin.

For silicon, $K_s$ is $2.5 \times 10^{-6}$ cm/cm °Kelvin. For boron nitride, $K_m$ is $1 \times 10^{-6}$ cm/cm °Kelvin. Young's modulus (E) for boron nitride is about $2 \times 10^{12}$ dynes/cm². The silicon substrate has been cooled to a temperature of about 77° K. ($-196°$ C.) and then assumed to come to ambient at about 293° K. (20° C.). Substituting these in the above equation, we have:

$$S = 2 \times 10^{12} \text{ dynes/cm}^2 [(2.5 \times 10^{-6} \text{ cm/cm °K.}) - (1 \times 10^{-6} \text{ cm/cm °K.})] [216° \text{ K.}] =$$
$$\text{about } 6.5 \times 10^8 \text{ dynes/cm}^2$$

Thus, in the above example, through the differential expansion of the cooled silicon substrate, a tensile stress of about $6.5 \times 10^8$ dynes/cm² has been introduced into the thereon deposited thin boron nitride film. It is preferable that the cooled substrate be allowed gradually to reach and assume ambient room temperature rather than being heated up thereto to speed up the process. In the latter case, the sudden differential expansion in the underlying susbtrate results in uneven stretching of the thin membrane over its surface and, at times, in ruptures of the membrane. In contrast therewith, a gradual warming of the substrate produces a gradual thermal expansion in the substrate material, resulting in a superior product.

It must be emphasized that the residual tensile stress thus imparted to the thin membrane 14 by the process of the invention is brought about independently of the deposition process parameters, which are selected only with a view to optimizing the quality of the resultant membrane (i.e., its crystallographic form, resistance to creep, transparency, defect density and the like) and to achieve the highest possible growth rate consistent with that quality. The residual stress in the resultant membrane is thus controlled independently of the deposition process parameters and primarily by the differential expansion of the cooled susbtrate 12 and the thereon deposited thin membrane 14.

Thus, it has been shown and described an improved process for growing thin membranes for use as X-ray lithography mask blanks, which process satisfies the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. A process of growing a membrane for use as an X-ray mask blank comprising:
   (a) providing a mounting fixture;
   (b) providing a substrate on said mounting fixture;
   (c) lowering the temperature of said substrate to about the boiling point of hydrogen by cooling said mounting fixture;
   (d) depositing a membrane on said substrate while the same is being maintained at about said cooled temperature;
   (e) removing said substrate and the thereon deposited membrane from said mounting fixture; and (f) allowing said substrate to rise to ambient temperature.

2. The process of claim 1 wherein said substrate is a low-grade industrial silicon substrate.

3. The process of claim 1 wherein said deposition of said membrane is effected by a low-temperature plasma-enhanced method.

4. The process of claim 1 wherein said membrane is formed of one of the following group of materials: boron nitride, silicon carbide, silicon nitride, amorphous silicon, diamond-like carbon, aluminum oxide, beryllium and silicon oxide.

5. The process of claim 1 wherein said membrane is desposited with a thickness ranging from about 500 to about 6,000 nanometers.

6. A process of growing a membrane for use as an X-ray mask blank comprising:
(a) providing a mounting fixture with a channel therethrough;
(b) providing a low-grade industrial silicon substrate on said mounting fixture;
(c) cooling said substrate to a temperature of about 20° Kelvin by passing a liquid coolant through said channel of said mounting fixture;
(d) depositing a membrane with a thickness ranging from about 500 to about 6,000 nanometers onto a surface of said cooled substrate while the same is being maintained at about said cooled temperature, said deposition being effected by a low-temperature plasma-enchanced method;
(e) removing said substrate and the thereon deposited membrane from said mounting fixture; and
(f) allowing said substrate gradually to assume ambient room temperature.

7. The process of claim 6 wherein said membrane is formed of one of the following group of materials: boron nitride, silicon carbide, silicon nitride, amorphous silicon, diamond-like carbon, aluminum oxide, beryllium and silicon oxide.

8. The process of claim 6 wherein said deposition of said membrane is effected in about two hours.

9. A process of growing a thin membrane with an optimum tensile stress for use as an X-ray mask blank comprising:
(a) providing a mounting fixture with a channel therethrough;
(b) providing a substrate material on said mounting fixture;
(c) cooling said substrate to a temperature of about 77° Kelvin by passing a liquid coolant through said channel;
(d) depositing by a low-temperature plasma-enhanced method a thin membrane onto said cooled substrate while the same is being maintained at about said temperature;
(e) removing said substrate and the thereon deposited membrane from said mounting fixture; and
(f) allowing said substrate thermally to expand by assuming ambient room temperature, whereby said deposited membrane will acquire optimum tensile stress required for further processing thereof.

10. The process of claim 9 wherein said substrate material is amorphous silicon and wherein said membrane is formed of boron nitride, and wherein said optimum tensile stress is computed as follows: $S = 2 \times 10^{12}$ dynes/cm$^2$ [$(2.5 \times 10^{-6}$ cm/cm °Kelvin $- (1 \times 10^{-6}$ cm/cm °Kelvin)] $216 =$ about $6.5 \times 10^8$ dynes per cm$^2$.

* * * * *